United States Patent [19]
Decker et al.

[11] 3,986,196
[45] Oct. 12, 1976

[54] THROUGH-SUBSTRATE SOURCE CONTACT FOR MICROWAVE FET

[75] Inventors: David Richard Decker, Los Altos; Masahiro Omori, Palo Alto, both of Calif.

[73] Assignee: Varian Associates, Palo Alto, Calif.

[22] Filed: June 30, 1975

[21] Appl. No.: 591,690

[52] U.S. Cl. .................. 357/22; 357/23; 357/55; 357/68; 357/81
[51] Int. Cl.² .............. H01L 29/80; H01L 29/06; H01L 23/48; H01L 23/02
[58] Field of Search ............ 357/22, 23, 68, 81, 357/55

[56] References Cited
UNITED STATES PATENTS
3,787,252  1/1974  Fillippazzi et al. ............ 357/68

*Primary Examiner*—Edward J. Wojciechowicz
*Attorney, Agent, or Firm*—Stanley Z. Cole; Gerald M. Fisher

[57] ABSTRACT

A microwave field effect transistor (FET) comprises source, gate, and drain electrodes deposited on an epitaxial layer grown on a semi-insulating substrate. The FET has lowered thermal resistance, lowered source lead inductance, and lowered gate series resistance, together with concomitant performance improvements, through the use of a novel source electrode connection which comprises a deposited or plated through metallic contact extending from the bottom of the wafer, through a hole in the substrate and epitaxial layer, to the underside of the source or other electrode which is deposited on the top side of the epitaxial layer. The chip, comprising the substrate, epitaxial layer, and top electrodes, is mounted on a heat sink. The chip's underside, including the bottom surface of the plated through source contact, is conductively bonded to the top surface of the heat sink.

9 Claims, 4 Drawing Figures

SECTION OF COMPLETED DEVICE MOUNTED ON HEAT SINK

PLATED THROUGH SOURCE CONTACT-20

SECTION OF DEVICE IN INTERMEDIATE STAGE OF FABRICATION

SECTION OF COMPLETED DEVICE MOUNTED ON HEAT SINK

TOP VIEW OF DEVICE OF FIG. 2

CROSS SECTION OF DEVICE WITH HEAT SINK BONDED INTO MICROSTRIP CIRCUIT

THROUGH-SUBSTRATE SOURCE CONTACT FOR MICROWAVE FET

BACKGROUND OF THE INVENTION

1. The Invention

This invention relates to transistors and particularly to a new type of structure for a microwave field effect transistor (FET). This invention was made in the performance of work under a contract with the U.S. Department of the Navy.

2. Description of the Prior Art

Field effect transistors of the MESFET (metalsemiconductor-FET) type generally comprise a body of semiconductive material, the upper layer at least of which is epitaxially grown and which has formed on the upper surface thereof a plurality of conductive electrodes, generally source, gate, and drain electrodes. The source and drain electrodes are generally ohmic contacts to the surface of the epitaxial layer while the gate electrode is generally formed to provide a rectifying or Shottky barrier contact so as to create a depletion region between the source and drain, whereby changing the bias on the gate can control the carriers in this region and thereby control the source-drain current and hence the gain of the FET.

Contacts to the surface electrodes (source, gate, and drain) are usually made by the use of wire leads extending from electrodes on the chip to contact lands spaced from the chip and mounted on an adjacent circuit. This method of contacting the FET has several disadvantages.

For one, the wire leads from electrodes to lands have significant inductance and resistance at microwave frequencies. As is known, the provision of such series inductance and resistance in association with active microwave elements raises the noise figure of the active element and limits the maximum frequency of operation, i.e., the maximum frequency at which usable gain can be obtained from the active element.

Another disadvantage of the prior art arrangement is that heat generated adjacent the source electrode was not able to escape readily from the device due to the fact that the thin wire leads do not conduct significant heat and the actual semiconductor body of the device itself is not a good thermal conductor. Thus the thermal resistance of the device, which is defined as the amount of temperature rise of the device per unit of power dissipated in the device, was high, being generally about 50° centigrade per watt. Such a high thermal resistance severely limits the RF power capability of the device since the amount of power which can be handled by the device is limited by the maximum safe operating temperature of the device. As is known, a reduction of the thermal resistance of the device would increase the amount of power which could be handled by the device while still operating under its safe maximum temperature.

Another disadvantage of the need for wire leads on top of the device is the necessity of laying out such wire leads and the respective electrodes to which they are attached such that the leads do not contact each other. If it were possible to eliminate one or more of such leads, extra freedom would be provided in laying out the remaining wire leads and the respective electrodes such that shorter leads could be used, thereby to lower lead inductance and resistance; also the geometry or configurations of the top electrodes could be adjusted or changed in order to optimize such geometry and concomitant device performance.

OBJECTS

Accordingly, several objects of the invention are (1) to provide an improved and new novel field effect transistor, (2) to provide a field effect transistor with reduced lead inductance and resistance (3) to provide a field effect transistor with greatly reduced thermal resistance (4) to provide a field effect transistor in which one or more wire contact leads can be eliminated, thereby to provide increased freedom for electrode configurations and remaining wire contacts, (5) to provide a field effect transistor with lower noise figures, and (6) to provide a field effect transistor with an increased maximum frequency of operation. Further objects and advantages of the invention will become apparent from a consideration of the ensuing description thereof.

DESCRIPTION OF THE PREFERRED EMBODIMENT

Figure 1:
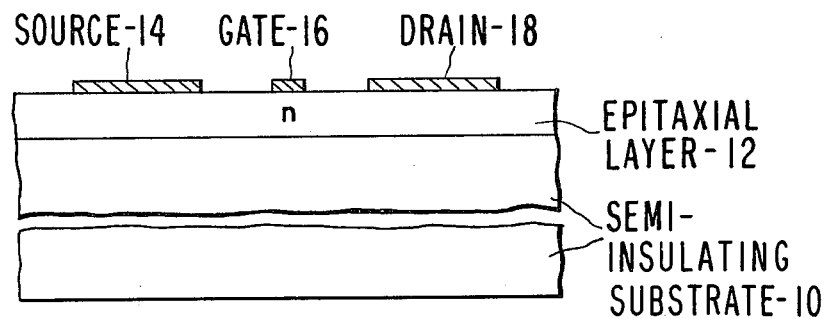
FIG. 1 shows a section of a device according to the invention in an intermediate stage of fabrication.

To form devices according to the invention, a starting wafer or substrate of a substantially intrinsic, high resistivity III–V material such as gallium arsenide, having a resistivity of greater than $10^5$ ohm-cm is provided. Such substrate may be about 2.5 cm in diameter and about 0.25 mm thick. A small portion of such wafer is shown at 10 in FIG. 1; such portion is sufficient to hold a single device.

Over substrate 10 is grown an n-type epitaxial layer 12 about 3000 A thick of GaAs and doped with S or Sn to have a doping density of about $10^{17}$ per cc.

Figure 3:
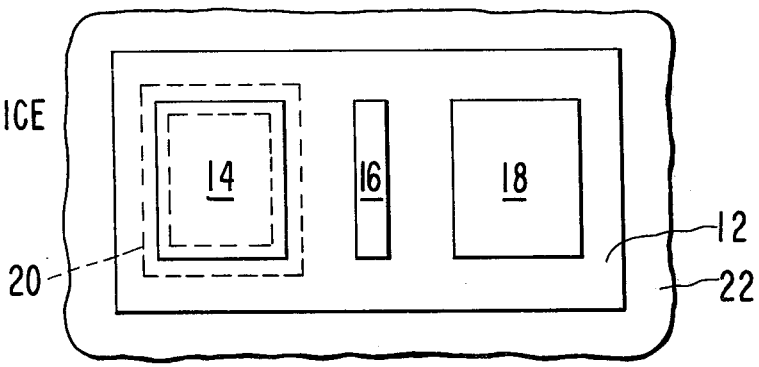
FIG. 3 shows a top view of the device of FIG. 2.

At each "transistor site" on the surface of wafer 10, source, gate, and drain electrodes 14, 16, and 18, respectively, are formed of appropriate metals. Such electrodes may be formed by well-known evaporation and etching techniques and may have a configuration such as illustrated in FIG. 3. In a typical wafer of the size indicated, about 1,500 sets of electrodes, each constituting a separate FET, are formed.

Next the top surface of the wafer is mounted or adhered to a fixture and, using well-known techniques, substrate 10 is reduced in thickness from the bottom side thereof until the entire device is about 75 microns thick.

Next, and still working from the bottom side of the wafer, holes are etched through the wafer, including layers 10 and 12, behind each source electrode 14 such that the underside of each source electrode is exposed and accessible from the bottom of the wafer. Such holes are etched by well-known photolithographic processes wherein a mask is formed over the bottom of the wafer, holes are formed in the mask, and an etchant is applied to the wafer which etches the semiconductive material of layers 10 and 12 but does not etch the mask or the metal of source electrode 14 at a sufficient rate to destroy layer 14 before etching thereof can be terminated. A suitable etchant is $H_2SO_4:H_2O_2:H_2O$ and the dimensions of the opening of the bottom of the wafer should be a rectangle about 0.076 × 0.23 mm and the opening at the top of the wafer will be about 0.05 × 0.2 mm, which is slightly smaller than the opening on the bottom of the wafer.

The alignment of the holes on the bottom of the wafer should be relatively precise so that when the holes are etched through to the top surface of the wafer, they come directly under the source electrode. Such alignment is preferably done by commercially available image superposition arrangements wherein, through the use of mirrors, an image of the top surface of the wafer is projected on the bottom surface of the wafer in perfect alignment with the actual top surface of the wafer. Alternatively, alignment can be done by measuring the location of the source electrodes from a fixed reference point and making corresponding measurements at the bottom surface of the wafer.

After the holes are etched through the wafer and etching is terminated, metallization is applied to the holes as indicated at 20 such that the metal will extend entirely through the wafer from the underside of the wafer and contact source region 14. Such metallization may be done by standard evaporation or plating processes; a suitable metal is gold. The metal is preferentially deposited at the holes such that it will entirely fill each hole as indicated at 20 in FIG. 2. Metal may also be deposited in a thin layer over the entire bottom surface of the wafer to facilitate its contact to the heat sink.

Figure 2:
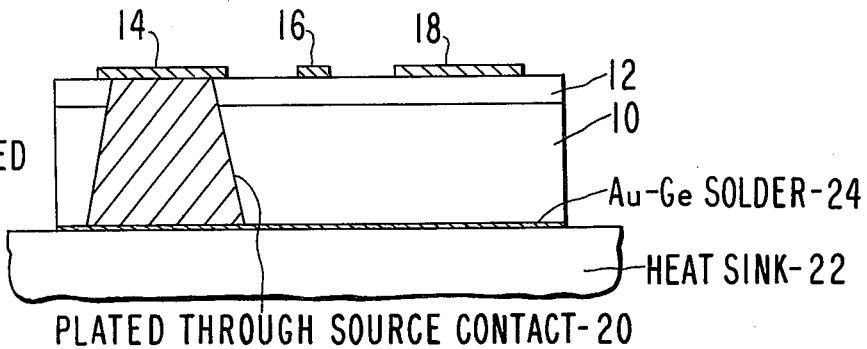
FIG. 2 shows a section of a completed device mounted on a heat sink.

After the formation of source contact 20, the wafer is separated into individual FET chips as shown in FIG. 2, each chip being of rectangular shape about 0.66 × 1.07 mm.

Figure 4:
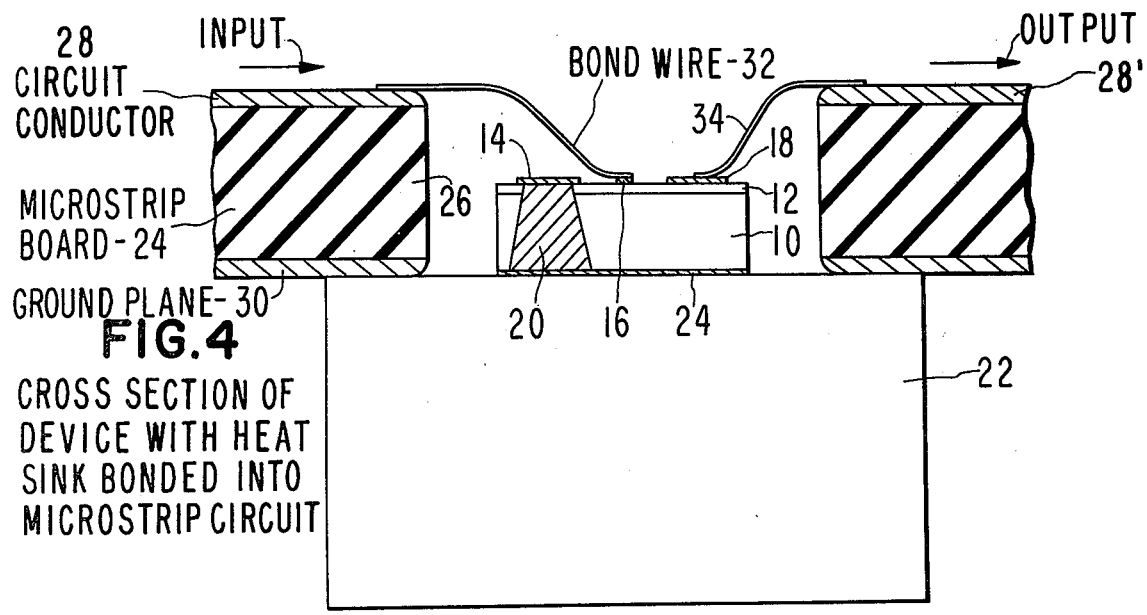
FIG. 4 shows a cross section of the device including a heat sink bonded to a microstrip circuit.

Each individual chip is then bonded to a heat sink 22, which is shown in full view in FIG. 4. Heat sink 22 may be a right circular cylinder of gold-plated copper having a diameter of about 1.8 mm and a thickness (height) of about 3.8 mm and can bonded to the FET chip by a gold-germanium solder layer 24.

Thereafter a circumferential area of the surface of heat sink 22 is bonded to the underside of a hole in a microstrip circuit board 24. Circuit board 24 consists of an intermediate insulating layer 26 of alumina about 0.64 mm thick having upper and lower conductive coatings 28 and 30 of gold. Lower layer 30 is a ground plane and preferably is continuous over the entire bottom surface of board 24, but upper layer 28 may constitute conductors or portions of conductors of microwave circuitry, including resistors, capacitors, conductors which are formed on board 24.

Ground plane 30 is conductively connected to heat sink 22 by soldering or welding. Gate electrode 16 is connected to one part of circuit conductor 28 by a bond wire 32 and drain electrode 18 is connected to another portion of circuit conductor 28' by another bond wire 34. Bond wires 32 and 34 are attached by well-known thermocompression bonding or ultrasonic welding techniques. Such bond wires may be formed of gold and have a diameter of about 25 microns.

Circuit conductor 28 may constitute an input circuit for the FET which applies an input signal, via wire 32, to gate electrode 16 and circuit conductor 28' may constitute an output circuit which receives an output signal via bond wire 34. Source electrode 14, being connected to ground plane 30 via source contact 20 and heat sink 22, constitutes a common connection.

Through the use of source contact 20, which has a very low inductance and very low resistance, the series inductance and resistance in the connection to source electrode 14 is greatly reduced in relation to what it would be had a conventional bond wire such as 32 or 34 been used in lieu thereof. Such reduction of source input resistance and inductance greatly lowers the noise figures at the X-band and above and permits an increase in the maximum frequency of operation of the transistor.

Even more important than the foregoing is the fact that source contact 20 provides a very low thermal impedance path from the source electrode to heat sink 22. This heat generated at the source electrode is rapidly and efficiently conducted to heat sink 22 over source contact 20, which has a much lower thermal impedance than does substrate 10 and epitaxial layer 12. The greatly improved heat dissipation ability of the FET provided by the use of source contact 20 significantly reduces the thermal resistance of the FET structure by about an order of magnitude, i.e., from about 50° centigrade per watt (C/W) to about 5° C/W. This improvement will permit dramatic gains in r.f. power capability of about one or more orders of magnitude.

Also, through the elimination of one bond wire at the top of the structure, design geometry layout is greatly facilitated and additional freedom in lead routing and the capability to parallel additional transistors without fear of lead crossovers is provided.

The entire device, including circuit board 24 and the FET chip, or plural FET chips, can be mounted in a conductive enclosure or cavity with suitable r.f. or microwave input and output conductors, in well-known fashion.

While the above description contains many specificities, these should not be construed as limitations on the scope of the invention, but rather as an exemplification of one preferred embodiment thereof. Many other variations will be seen. For example, a plated-through contact 20 may instead be associated with drain electrode, or to both the source and drain electrodes if an isolation region is provided in the chip. The chip may be packaged in other manners than that shown. Accordingly, the scope of the invention should be determined not by the embodiment illustrated, but by the appended claims and their legal equivalents.

What is claimed is:

1. A field effect transistor comprising a body of semiconductive material having upper and lower surfaces, at least three spaced metallic electrodes on the upper surface of said body, a first of which is positioned between the second and third of said electrodes in the plane of said surface, said first electrode making a rectifying contact to said surface, said second and third electrodes each making an ohmic contact to said surface, and means providing a contact to one of said ohmic contact electrodes from the lower surface of said body, said means comprising a metallic contact extending through said body from said lower surface thereof to the underside of said ohmic contact electrode, the sides of said metallic contact adjacent said body being in direct electrical contact with said body.

2. The transistor of claim 1 wherein said first, second and third electrodes are source, gate, and drain electrodes, said one of said ohmic contact electrodes being said source electrode.

3. The transistor of claim 1 wherein the surface of said metallic contact in contact with the underside of said ohmic contact electrode is in contact with a major portion of said underside.

4. The transistor of claim 3 wherein said surface of said metallic contact in contact with the underside of said ohmic contact is symmetrically positioned with respect to said underside.

5. The transistor of claim 1 wherein said metallic contact is gold and said body is composed essentially of III–V materials.

6. The transistor of claim 1 wherein said body comprises a substrate of relatively high resistivity and an epitaxial layer of lower resistivity over said substrate, said metallic contact extending through both said substrate and said epitaxial layer.

7. The transistor of claim 1 wherein said metallic contact is rectangular in cross section, the upper surface thereof in contact with said one electrode having a smaller area than the lower surface thereof, said lower surface thereof being coplanar with the lower surface of said body.

8. The transistor of claim 1 wherein a portion of said metallic contact, at the lower surface of said body, is conductively bonded to a heat sink.

9. The transistor of claim 8 wherein contact means are provided to said plurality of electrodes at the top surface of said body, other than said one electrode.

* * * * *